TRANSISTOR INSULATOR WITH SELF-CONTAINED SILICONE GREASE SUPPLY

Filed Dec. 27, 1966

INVENTOR.
Richard A. Sudges
BY Nicholas A. Camasto
ATTY.

3,391,242
TRANSISTOR INSULATOR WITH SELF-CONTAINED SILICONE GREASE SUPPLY

Richard A. Sudges, Chicago, Ill., assignor to Admiral Corporation, Chicago, Ill., a corporation of Delaware Filed Dec. 27, 1966, Ser. No. 604,911
8 Claims. (Cl. 174—15)

This invention relates in general to heat producing semiconductive devices, and in particular to the application of thermal conductive compound to the junction of a heat producing semiconductive device and a heat absorbing member. More particularly, this invention relates to means for more easily applying an adequate quantity of silicone compound to an electrically insulated junction of a heat producing transistor and a heat absorbing member.

Many varieties of transistors, particularly power transistors, are operated under conditions which cause the semiconductive material to convert large quantities of electrical energy into thermal energy, or heat. The heat is conducted to a metal transistor case, and must be dissipated to prevent overheating of the semiconductive material and possible damage to, or destruction of, the power transistor. Consequently, power transistors are usually mounted in intimate contact with a heat absorbing member, commonly called a "heat sink," which is a structure having a relatively high thermal conductivity, such as metal, and of sufficient weight to adequately absorb heat from the transistor. The heat sink may be provided with radiating fins to dissipate the absorbed heat and hence have a greater effective capacity. In many instances where the quantity of heat dissipated from the power transistor is insufficient to warrant a separate heat sink, the chassis of the device in which the transistor operates is utilized as the heat sink.

Power transistors are usually designed with a thick, planar mounting base which also serves as one of the transistor electrical terminals, conventionally its collector. In order to obtain good heat transfer, the transistor mounting base must be maintained in intimate contact with the heat sink. To achieve this intimate contact, a thermally conductive compound is applied to the mating surfaces of the base and the heat sink. (One such thermally conductive compound which is also electrically nonconductive, is known as silicone grease.) The thermally conductive compound fills the voids and gaps between the two mating surfaces, and compensates for any unevenness thus providing a good heat transferring bond between the transistor mounting base and heat sink.

In many chassis layouts where it is desirable to use the metal chassis as the heat sink, it is also desirable to maintain the chassis at a different electrical potential than the transistor mounting base. Consequently, the transistor base must be electrically insulated from the chassis by an electrical insulating member which must also be capable of conducting heat therebetween. Mica, in wafer like sheets, is widely used for this purpose since it has excellent electrical insulating characteristics, and also has extremely good heat transferring capabilities.

When power transistors are to be mounted to, and electrically insulated from a chassis, silicone grease is applied to the mating surfaces of the transistor mounting base and one side of the insulator, and between the chassis and the remaining side of the insulator. As mentioned above, the silicone grease fills any voids between the mating surfaces thereby insuring intimate contact and good heat transfer from the transistor to the heat sink.

It can be appreciated that the application of silicone grease, a viscid, clinging substance, is typically a messy and undesirable job. In addition, if too much silicone grease is applied to the mating surfaces, the excess is squeezed out the sides and wasted. On the other hand, if an insufficient quantity of silicone grease is applied, there may be inadequate heat transfer to the heat sink, thus the transistor will operate at a higher temperature than anticipated, and may exhibit undesirable operating characteristics, or may even be destroyed.

This invention obviates many of the problems and difficulties prevalent in the application of silicone grease to the mating surfaces of a transistor mounting base, an electrical insulator, and a heat sink, by providing an electrical insulator having a self-contained supply of silicone grease. The electrical insulator comprises two layers of electrical insulating material having small holes therethrough for passage of the silicone grease, which is stored in the space between the layers. The double layer electrical insulator and the silicone grease form a sandwich like assembly which may be easily handled and stored. When the transistor is ready to be fastened to the heat sink, the sandwich assembly is positioned therebetween. Securing the mounting base to the heat sink, then squeezing the insulating layers together forces the silicone grease through the holes. The grease flows into the junction between the transistor base and the surface of its adjacent electrical insulating member and between the chassis and the surface of its adjacent electrical insulating member. There is also a thin coating of grease between the opposing surfaces of the two electrical insulating members.

In addition, the invention eliminates the waste of silicone grease, since a predetermined quantity of grease can be deposited between the layers of insulation. Depositing a predetermined quantity of grease also insures that an adequate amount is applied, thus preventing damage to the transistor from overheating.

Accordingly, the primary object of this invention is to provide an electrical insulator for a transistor, having a self-contained supply of silicone grease which is automatically applied to the mating surfaces as the transistor base is fastened to a heat absorptive member.

Another object of this invention is to provide simplified means for applying a thermally conductive and electrically nonconductive compound between a transistor base and a heat absorptive member, while electrically insulating said transistor base from said member.

A further object of this invention is to facilitate the application of silicone grease to the electrically insulated junction of a heat producing transistor and a heat absorptive member.

It is also an object of this invention to provide simplified means for handling silicone grease and electrical insulators for use in providing electrical insulation from, and heat transfer between, a transistor base and a heat absorbing member.

An additional object of this invention is to provide means for applying silicone grease to the electrically insulated junction of a heat sink and a transistor mounting base, in a manner which insures an adequate amount of said grease for good heat transfer.

Other objects of this invention will become apparent upon an examination of the following description taken in conjunction with the accompanying drawings wherein:

FIG. 1 illustrates an exploded perspective view of a diamond shaped transistor, an electrical insulator having two layers, a heat sink, and threaded fasteners for securing the transistor to the heat sink.

FIG. 2 is an assembled cross-sectional view taken along line 2—2 of FIG. 1, showing the sandwich assembly of two layers of electrical insulating material having silicone grease therebetween.

FIG. 3 is an assembled cross-sectional view, taken along the line 3—3 of FIG. 1, showing a transistor secured to a heat sink with a compressed sandwich assembly in-between. FIG. 3 also shows the flow of silicone grease between the adjacent surfaces of the electrical insulator, the transistor base, and the heat sink.

FIG. 4 is a plan view of an alternate embodiment of a transistor insulator having a self-contained supply of silicone grease.

FIG. 5 is an elevation view taken along line 5—5 of FIG. 4.

Figures 1, 2, 3, 4, 5:
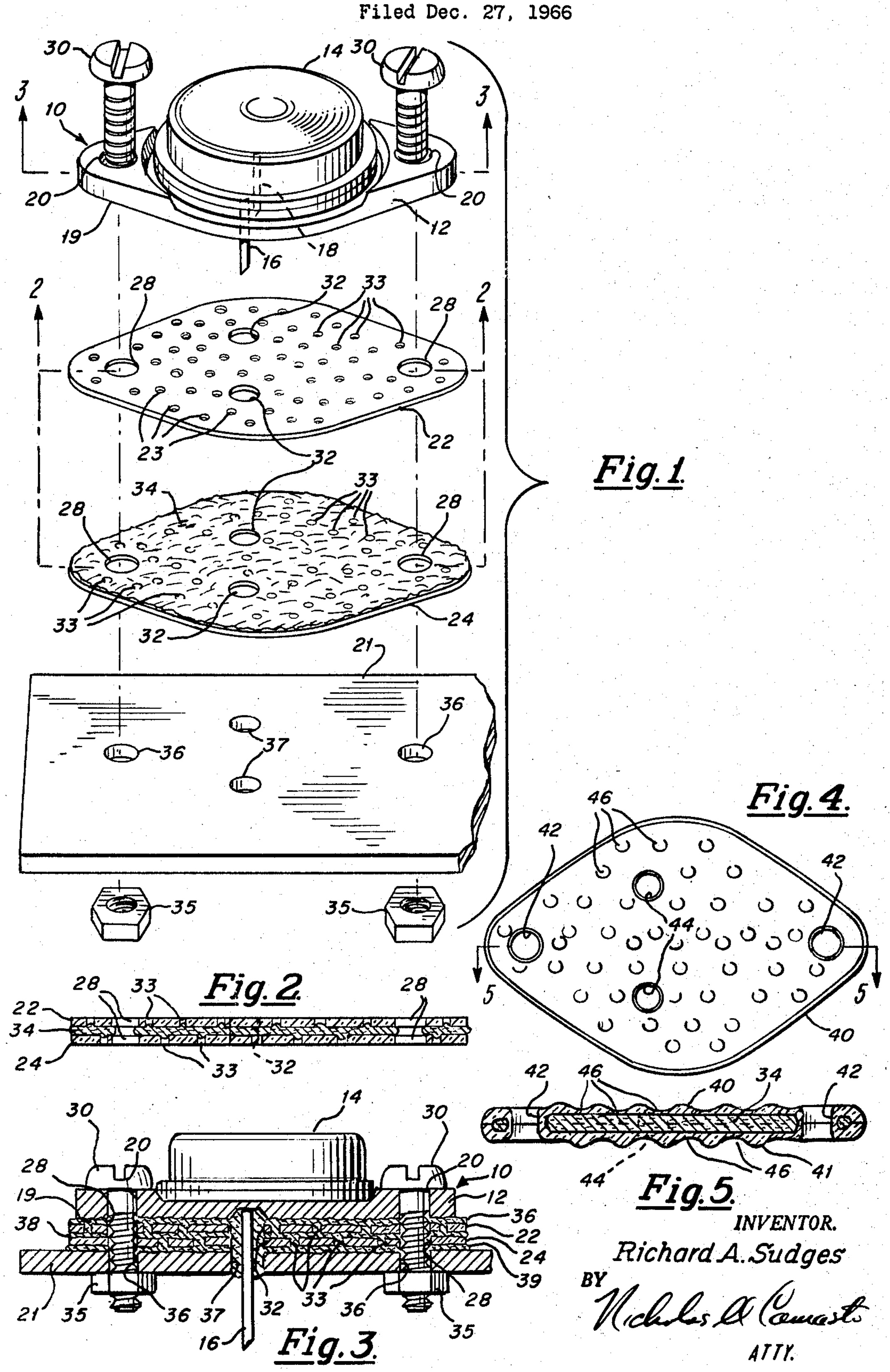

Referring now to the exploded view of FIG. 1, there is shown a diamond shaped power transistor generally referred to by reference numeral 10, having a mounting base portion 12, a cap 14, terminals 16 and 18 extending from the base, and mounting apertures 20 for securing the power transistor to a heat sink. Mounting base 12 is fabricated of metal, and is relatively thick to provide good heat conduction from cap 14 which houses the semiconductive material. The underside of base 12, referred to by reference numeral 19, is generally planar and is designed to be mounted in heat conductive relationship with a heat sink 21, which may comprise a metal chassis.

An electrical insulator having an upper layer 22 and a lower layer 24 is provided to electrically insulate the transistor base from the heat sink. Each layer of the electrical insulator is constructed of a wafer like material such as mica, having a shape similar to that of transistor base 12, but extending slightly beyond the periphery thereof. The layers of electrical insulation are relatively stiff, and each is provided with apertures 28 for receipt of electrically nonconductive mounting bolts 30. Each layer also has other apertures 32 which permit terminals 16 and 18 to extend through to the chassis.

Many small holes 33 are randomly provided throughout the remaining solid area of each electrical insulator, but care is taken that the small holes in one layer do not coincide with holes in the other layer. Offsetting the small holes provides better electrical insulation and reduces the possibility of an arc between the components which are maintained at different potentials.

Silicone grease 34, which as explained above, is a thermally conductive and electrically nonconductive compound, is deposited on an opposing surface of one layer of insulation, and when the two layers are brought together, they form a sandwich like assembly having silicone grease as its filling, as shown in FIG. 2. These assemblies, which contain their own supply of silicone grease, are preferably fabricated as an article of manufacture, such as by the manufacturer of the insulating material.

Referring now to FIG. 3, the sandwich assembly of electrical insulating material and silicone grease is positioned on the heat sink with its apertures 28 aligned with mounting apertures 36, therethrough. Apertures 32 through each layer of insulating material are aligned with clearance openings 37 through the heat sink, to prevent shorting transistor terminals 16 and 18. Transistor 12 is then placed on top of the insulator, with its terminals extending through the clearance holes in the heat sink. The nonconductive bolts are inserted through the components, and tightened into nuts 35, forcing the layers of insulating material toward each other. As the bolts are tightened, the grease is exuded through holes 33 and fills any voids or gaps between the mating surfaces. As shown in FIG. 3, the silicone grease is forced between the transistor base and the top surface of the upper insulator 36, between the opposing surfaces of the insulators 38, and between the lower surface of the bottom insulator and the chassis 39. As mentioned above, the silicone grease insures good heat transfer between the transistor base and the chassis, in this case through two layers of electrical insulating material.

It can be readily seen that once the sandwich assembly is fabricated, it may be easily handled on the assembly line with a minimum of mess and waste. The assembler merely handles the electrical insulator by its edges while positioning it on the heat sink, with all the mounting and terminal apertures aligned with the apertures through the heat sink. Tightening the mounting screws spreads the silicone grease to coat the proper areas. In addition, the premade sandwich assemblies can be provided with a predetermined quantity of silicone grease to insure proper coating of the heat transferring surfaces.

Referring now to FIGS. 4 and 5, there is shown an alternate embodiment of a transistor insulator having a self-contained supply of silicone grease. In this embodiment, the electrical insulator comprises two layers of pliable, flexible, electrical insulating material 40 and 41, such as Teflon or Mylar, instead of the stiff mica. The layers of insulating material also include mounting apertures 42 and terminal apertures 44, but instead of holes through the insulating material, weakened, frangible areas 46 are provided. The frangible areas may be fabricated by a stamping process which stretches the material, forming dimples therein. The silicone grease is deposited between the layers of insulation as shown in FIG. 5, and the free edges thereof, including the edges around the apertures, are sealed by any suitable means such as by heating. The silicone grease is captivated inside the insulation layers and is released by compressing the layers and rupturing the frangible areas. The grease then flows to fill the voids and gaps as in the previous embodiment.

The alternate embodiment, while being more difficult to manufacture since the edges require sealing, would be easier to handle since the silicone grease is fully enclosed within the insulator and ordinarily could not escape.

What has been described is a transistor insulator having a self-contained supply of silicone grease in a sandwich like assembly. The assembly eliminates many of the difficulties inherent in the application of silicone grease to the mating surfaces of a transistor, electrical insulator, and heat sink, and insures an adequate coating for good heat transfer.

It is obvious that upon study by those skilled in the art, the disclosed invention may be altered or modified both in physical appearance and construction without departing from its inventive concept. Therefore, the scope of protection to be given this invention should not be limited by the embodiments described above, but should be determined by the essential descriptions thereof which appear in the appended claims.

The embodiments of the invention in which an exclusive property or privilege is claimed are defined as follows:

1. In combination with two adjacent surfaces, means for maintaining said surfaces separate and for coating them with flowable material comprising: two wafer shaped separating members arranged in spaced, substantially parallel relationship, each of said members having passage means therethrough; flowable material deposited in the space between said members, forming a sandwich-like assembly; said assembly positioned between said surfaces; and means forcing said surfaces together, whereby said flowable material is exuded through the passage means, thereby coating said surface.

2. Means for applying thermally conductive and electrically nonconductive compound to an electrically insulated juncture of a heat producing electrical element and a heat absorptive member comprising: electrical insulating means; said insulating means containing said thermally conductive and electrically nonconductive compound; said insulating means positioned between said electrical element and said heat absorptive member; means for releasing said compound upon compressing said insulating means; and means firmly securing said electrical element to said heat absorptive member thereby compressing said insulating means, whereby said compound is released coating the juncture of said electrical element and said insulating means, and the juncture of said insulating means and said heat absorptive member for more intimate contact and more efficient heat transfer therebetween.

3. The means as set forth in claim 2 wherein said electrical insulating means comprise two separable layers of electrical insulating material; said thermally conductive and electrically non-conductive compound having viscid properties and being disposed between said layers, forming a sandwiched assembly for ease of handling; and wherein said means for releasing said compound comprises apertures defined by each layer of said electrical insulating material, said compound exuding through said apertures upon being compressed between said electrical element and said heat absorptive member.

4. The means as set forth in claim 3 wherein the apertures defined by each layer of said electrically insulating material are noncoincident, thereby precluding areas without electrical insulation between said heat absorptive member and said electrical element.

5. The means as set forth in claim 2 wherein said heat producing electrical element comprises a transistor of small mass having a substantially planar mounting base serving as an electrical terminal; said electrical insulating means comprising two closely spaced, inflexible, wafer like electrical insulators each having the general shape of said transistor base and containing said thermally conductive and electrically nonconductive compound therebetween; said compound having viscid properties which maintain said insulators in a sandwiched relation for ease of handling; each of said insulators defining apertures therethrough for passage of said compound upon being compressed; whereby when said insulators are compressed, said compound is exuded through said apertures filling any voids between said transistor base and said insulator and between said insulator and said heat absorptive member for more efficient heat transfer from said transistor to said heat absorptive member.

6. The means as set forth in claim 5 wherein said electrical insulators are fabricated of mica having apertures formed therein, but arranged to be noncoincident to preclude electrically conductive areas between said transistor base and said absorptive member; and wherein said compound comprises silicone grease.

7. Means for applying flowable, thermally conductive and electrically nonconductive compound to the opposing surfaces of a transistor base and a heat absorptive member which are maintained at different electrical potentials, comprising: an electrical insulator fabricated of two separable layers, each of said layers of sufficient size to overlap the periphery of said transistor base, and each layer including frangible areas; said thermally conductive and electrically nonconductive compound deposited between the layers of said insulator; means sealing the edges of said insulator, thereby confining said compound to facilitate handling thereof; said insulator positioned between said transistor base and said heat absorptive member; and means firmly securing said transistor base to said heat absorptive member, thereby compressing said insulator, rupturing said frangible areas, and forcing said compound between said transistor base and said insulator and between said insulator and said heat absorptive member; said compound providing intimate contact between said transistor base and said heat absorptive member for more efficient heat transfer.

8. The means as set forth in claim 7 wherein the amount of compound deposited between the layers of each of several insulators is controlled to insure adequate heat transfer from said transistor base to said heat absorptive member.

References Cited

UNITED STATES PATENTS 1,824,997 9/1931 Howard -------------- 184—1

FOREIGN PATENTS 236,202 10/1961 Australia.
659,585 3/1963 Canada.

OTHER REFERENCES

Donegan et al., "Heat Conducting Washer," IBM Technical Disclosure Bulletin, vol. 8, No. 1, June 1965, p. 206.

LARAMIE E. ASKIN, *Primary Examiner.*